(12) United States Patent
Park et al.

(10) Patent No.: US 6,465,895 B1
(45) Date of Patent: Oct. 15, 2002

(54) BONDING PAD STRUCTURES FOR SEMICONDUCTOR DEVICES AND FABRICATION METHODS THEREOF

(75) Inventors: Young-hoon Park, Kyungki-do; Eun-young Min, Anyang; Weon-cheol Hong, Suwon, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/826,590

(22) Filed: Apr. 5, 2001

(51) Int. Cl.[7] .............................................. H01L 23/48
(52) U.S. Cl. ...................................... 257/782; 257/758
(58) Field of Search ................................ 438/758–764; 257/698–784

(56) References Cited

U.S. PATENT DOCUMENTS

| | | | |
|---|---|---|---|
| 5,036,383 A | 7/1991 | Mori | 357/71 |
| 5,288,661 A | 2/1994 | Satoh et al. | 437/195 |
| 5,502,337 A | 3/1996 | Nozaki | 257/773 |
| 5,736,791 A | 4/1998 | Fujiki | 257/781 |
| 5,986,346 A | 11/1999 | Katoh | 257/773 |
| 6,020,647 A | 2/2000 | Skala et al. | 257/784 |
| 6,121,160 A | 9/2000 | Igarashi et al. | 438/780 |
| 6,127,724 A * | 10/2000 | DiStefano | 257/675 |
| 6,333,558 B1 * | 12/2001 | Hasegawa | 438/759 |
| 2002/0005583 A1 * | 1/2002 | Harada et al. | 257/758 |

* cited by examiner

Primary Examiner—David Nelms
Assistant Examiner—Long K. Tran
(74) Attorney, Agent, or Firm—Mills & Onello, LLP (57) ABSTRACT

The present invention is directed to a semiconductor structure, and a fabrication technique for forming such a structure, configured to confine and prevent expansion of cracking of the insulating layer below a bonding pad, that are generated as a result of the bonding process. In a first embodiment, the present invention includes a vertical frame, formed, for example of conductive material, surrounding the outer perimeter of the bonding pad, and extending through an underlying insulating layer. A horizontal frame lies below the vertical frame. Together, the vertical frame and horizontal frame confine cracks emanating below the bonding pad to within the frame region. In a second embodiment, horizontal and vertical portions of the frame are formed by a conductive layer provided in an opening formed in the insulating layer. Since the isolation frame prevents cracks from expanding into surrounding regions of the integrated circuit, overall process yield and reliability are improved.

34 Claims, 9 Drawing Sheets

BONDING PAD STRUCTURES FOR SEMICONDUCTOR DEVICES AND FABRICATION METHODS THEREOF

BACKGROUND OF THE INVENTION

Bonding pads are interconnect structures formed on an integrated circuit to provide an interface between internal circuitry and external pin leads of the integrated circuit package. Bonding wires provide for electrical contact between the pins and bonding pads. During application of a bonding wire, as the bonding wire is lowered into position on the bonding pad, mechanical stress is exerted on the bonding pad by the micropositioner machine used to position the wire. The stress, in turn, causes cracks and voids to form in the underlying insulator layer below the bonding pad. This, in turn, can expose an underlying metal layer, leading to possible deleterious effects such as corrosion and shorting of the underlying layer.

Figure 1:
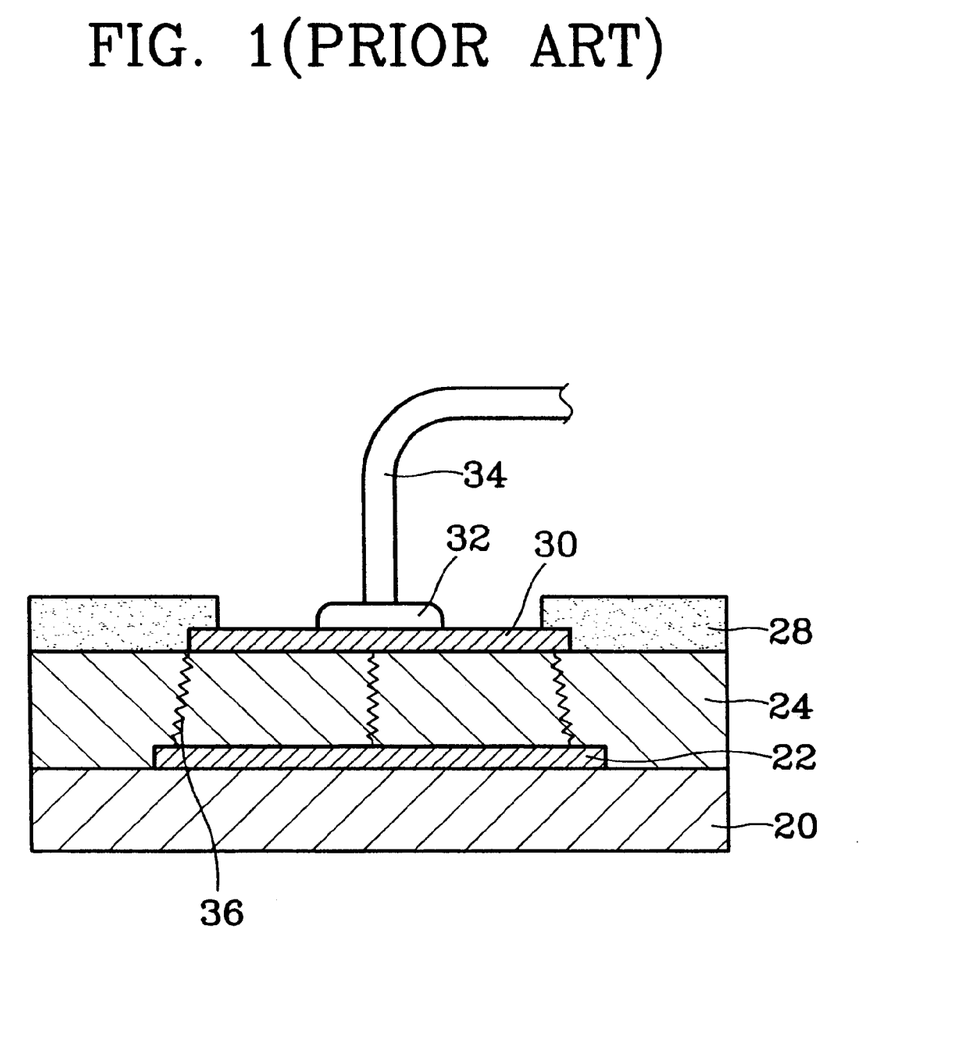
FIG. 1 is a sectional side view of a conventional bonding pad structure, illustrating cracking that is generated as a result of application of a bonding wire to the bonding pad.

A cross-sectional view of a conventional bonding pad configuration is provided in FIG. 1. In this example, a lower metal layer 22 is provided on a semiconductor substrate. An interlayer insulating film (referred to herein as an inter-layer dielectric (ILD)) 24 is formed over the metal later 22. A bonding pad 30 is formed on the ILD, and a passivation layer 28 is formed about the bonding pad 30.

A wire 34 is bonded to the bonding pad 30 at solder joint 32 using a pressurized thermal bonding process. During the bonding procedure, downward force is exerted on the bonding pad, which generates cracks and voids 36 in the underlying ILD. The stress tends to be concentrated at the horizontal edges of the bonding pad; rather than at the central portions. For this reason, cracks emanating outwardly from the edge regions can expand into adjacent regions of the semiconductor circuit. As the cracks emanate, they can actually become larger in width as the distance from the respective source increases. Such cracks can form an opening to expose the underlying metal layer, leading to possible corrosion, and can further extend through underlying metal layers, which can isolate regions of the metal layers, leading to circuit failure.

SUMMARY OF THE INVENTION

The present invention is directed to a semiconductor structure, and a fabrication technique for forming such a structure, configured to confine and prevent expansion of cracking of the insulating layer below a bonding pad, that are generated as a result of the bonding process. In a first embodiment, the present invention includes a vertical frame, formed, for example of conductive material, surrounding the outer perimeter of the bonding pad, and extending through an underlying insulating layer. A horizontal frame lies below the vertical frame. Together, the vertical frame and horizontal frame confine cracks emanating below the bonding pad within the frame region. In a second embodiment, horizontal and vertical portions of the frame are formed by a conductive layer provided in an opening formed in the insulating layer. Since the isolation frame prevents cracks from expanding into surrounding regions of the integrated circuit, overall process yield and reliability are improved.

In a first aspect, the present invention comprises a semiconductor bonding pad structure and a method for forming such a structure. An insulating layer is first provided and a bonding pad is formed on the insulating layer, the bonding pad having a horizontal boundary. At least one vertical frame formed of a conducting material is provided vertically through the insulating layer, the at least one vertical frame being horizontally positioned beyond the horizontal boundary of the bonding pad.

In a preferred embodiment, the present invention further comprises a horizontal frame extending horizontally through the insulating layer below the bonding pad. The horizontal frame preferably comprises a conducting material, for example selected from the group of a materials consisting of metal, polysilicon, and silicide. The at least one vertical frame may be positioned on, and in contact with, the horizontal frame.

The bonding pad may be shaped in a geometry including stress concentration regions, in which case, the at least one vertical frame is positioned proximal to the stress concentration regions. The at least one vertical frame may comprise multiple vertical frame segments positioned locally with respect to the stress concentration regions. The at least one vertical frame preferably substantially surrounds the horizontal boundary of the bonding pad, and extends through the entire depth of, or partially through, the insulating layer.

The at least one vertical frame may comprise a plurality of vertical frame segments vertically stacked through multiple insulating layers of the semiconductor device. A buffer layer may be formed on the insulating layer, the buffer layer having a horizontal boundary, and an intermediate insulating layer may be provided on the buffer layer, whereby the bonding pad is provided on the intermediate insulating layer above the buffer layer. In this case the at least one vertical frame may extend vertically through the insulating layer, positioned beyond the horizontal boundary of the buffer layer. The at least one vertical frame extension may extend vertically through the intermediate insulating layer above the at least one vertical frame and being horizontally positioned beyond the horizontal boundary of the bonding pad. Contact plugs may formed through the intermediate insulating layer, electrically contacting the buffer layer and bonding pad.

In a second aspect, the present invention is directed to a semiconductor bonding pad structure, and a method for forming the structure. The structure includes a horizontal frame having a horizontal boundary; an insulating layer above the horizontal frame; a bonding pad on the insulating layer above the horizontal frame, the bonding pad having a horizontal boundary; and at least one vertical frame provided vertically through the insulating layer, the at least one vertical frame being horizontally positioned beyond the horizontal boundary of the bonding pad.

In a third aspect, the present invention is directed to a semiconductor bonding pad structure and method for forming the structure. A first insulating layer is provided on an underlying layer, the insulating layer having an opening therein, the opening having a substantially horizontal lower surface and a substantially vertical side surface. A conductive layer is provided in the opening, the conductive layer having a horizontal portion formed on the horizontal lower surface of the opening and a vertical portion formed on the vertical side surface of the opening. A second insulating layer is provided on the conductive layer. A bonding pad is provided on the second insulating layer vertically positioned above the horizontal portion of the conductive layer and horizontally positioned between the vertical portion of the conductive layer.

The underlying layer may comprises a substrate or an underlying insulating layer. The underlying layer may comprise an intermediate conductive layer having, for example, an etch selectivity with respect to the first insulating layer.

The upper surface of the vertical portion of the conductive layer defines an upper rim wherein the bonding pad is preferably vertically positioned below, at, or above the upper rim. The second insulating layer preferably forms a depression extending into the opening and the bonding pad may be positioned within the depression. The depression may include inner side walls, wherein the bonding pad has an area less than the area defined between the inner side walls of the opening.

A buffer layer may be formed on the second insulating layer, the buffer layer having a horizontal boundary. An intermediate insulating layer may be provided on the buffer layer. In this case, the bonding pad is provided on the intermediate insulating layer above the buffer layer. Contact plugs may be formed through the intermediate insulating layer, electrically contacting the buffer layer and bonding pad.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention is directed to a semiconductor structure configured to contain and prevent expansion of cracking of the insulating layer below a bonding pad and a semiconductor fabrication technique for forming such a structure.

Figure 2A:
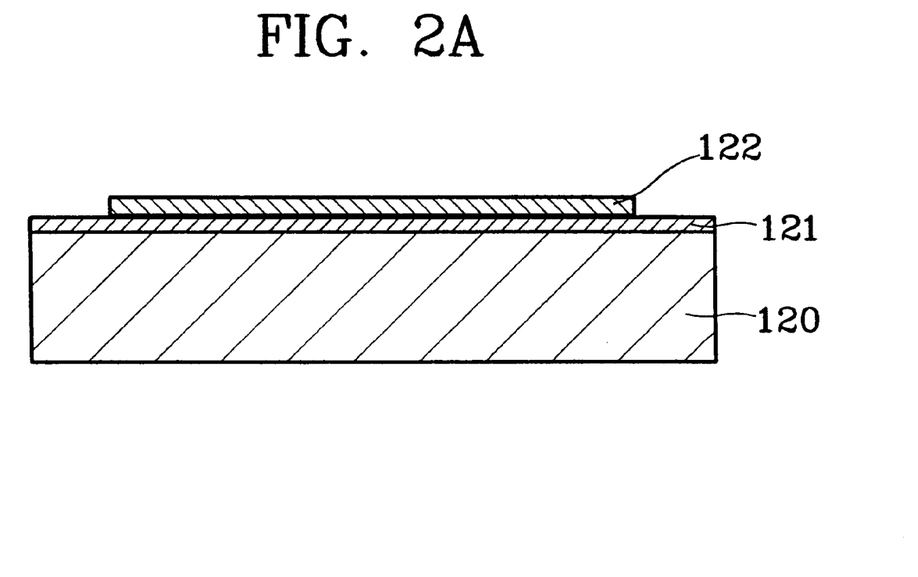
FIGS. 2A–2D are sectional side views of a fabrication process for forming a bonding pad structure in accordance with a first preferred embodiment of the present invention.

FIGS. 2A–2D are sectional side views of a preferred technique for forming a bonding pad structure in accordance with a first preferred embodiment of the present invention. With reference to FIG. 2A, an insulating layer 121 is provided on a semiconductor substrate 120. A first conductive layer, comprising, for example, metal (titanium, aluminum), polysilicon, or silicide, is provided on the insulating layer 121. The conductive layer is patterned to form a first horizontal conductive portion 122.

Figure 2B:
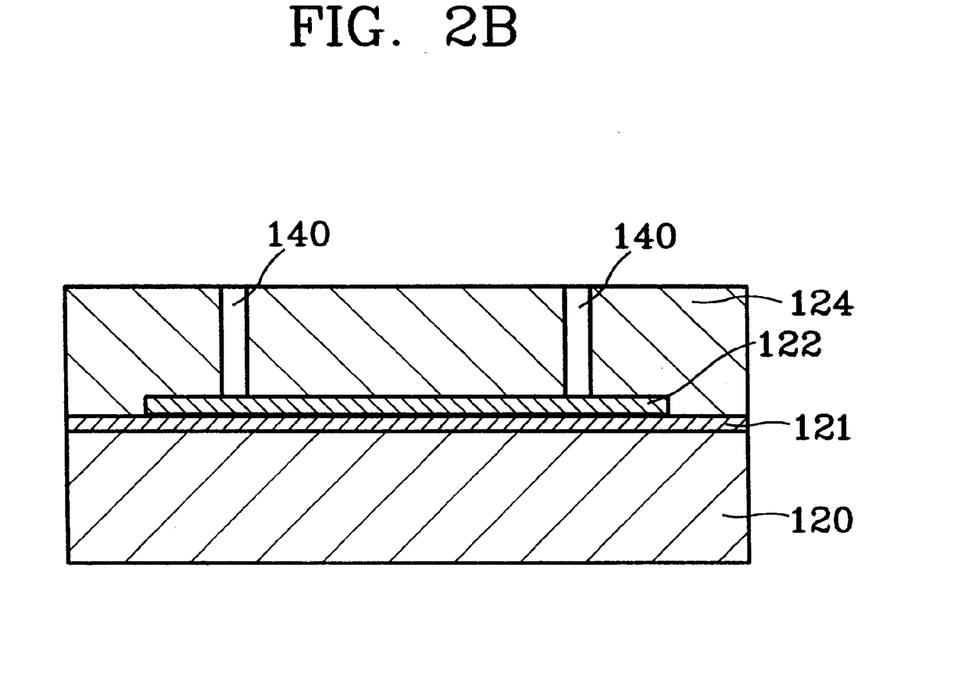

In FIG. 2B, an interlayer dielectric film (ILD) 124, for example comprising boron-phospho-silicate glass (BPSG), is provided on the resulting structure of FIG. 2A. Vertical holes, slots, or grooves 140 are patterned into the ILD 124, in the shape of a vertical boundary or frame above or about the horizontal conductive portion 122. The vertical boundary or frame may be a continuous groove 140A to enclose a geometric body of the ILD above the horizontal conductive portion 122, as shown in FIG. 3A described below, or may comprise segments of slots 140B, corresponding with the corners 131 of the bonding pad 130, from which cracks and fissures tend to emanate, as shown in FIG. 3B described below.

Figure 2C:
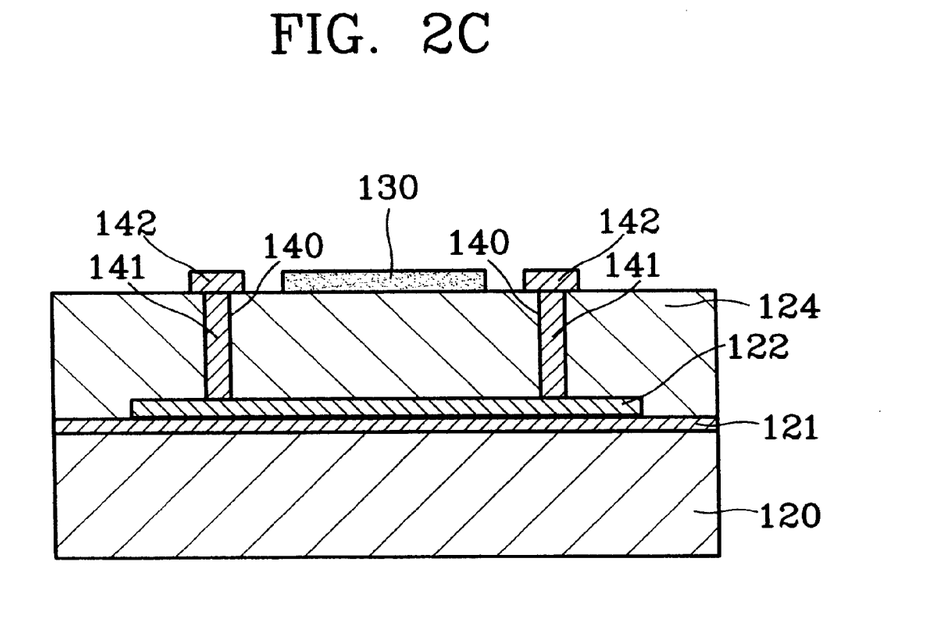

Referring to FIG. 2C, conductive material is provided in the holes/grooves/slots 140, so as to form a vertical isolation frame 141 of conductive material through the ILD. A bonding pad 130 is patterned on the ILD 124 within the boundary of the isolation frame 141. An optional interconnect pattern 144 (see FIGS. 3A, 3B) may be provided for connecting the bonding pad 130 with other portions of the circuit. As shown in FIGS. 3A and 3B respectively, the isolation frame 141 may take the shape of a continuous frame 141A about the outer perimeter of the bonding pad, or may comprise discontinuous portions 141B, for example, that occupy and enclose the corner regions 131 of the bonding pad 130, where cracks and fissures tend to concentrate. The conductive material to be deposited in the holes/grooves/slots 140, and the metal for forming the bonding pad, may comprise the same conductive material layer, formed contemporaneously in the same process step, or may comprise different materials, deposited at the same, or different, times. Top portions 142 of the isolation frame 141, may extend horizontally above the ILD 124 as shown, depending on the photolithographic process used to form the bonding pad 130.

Figure 2D:
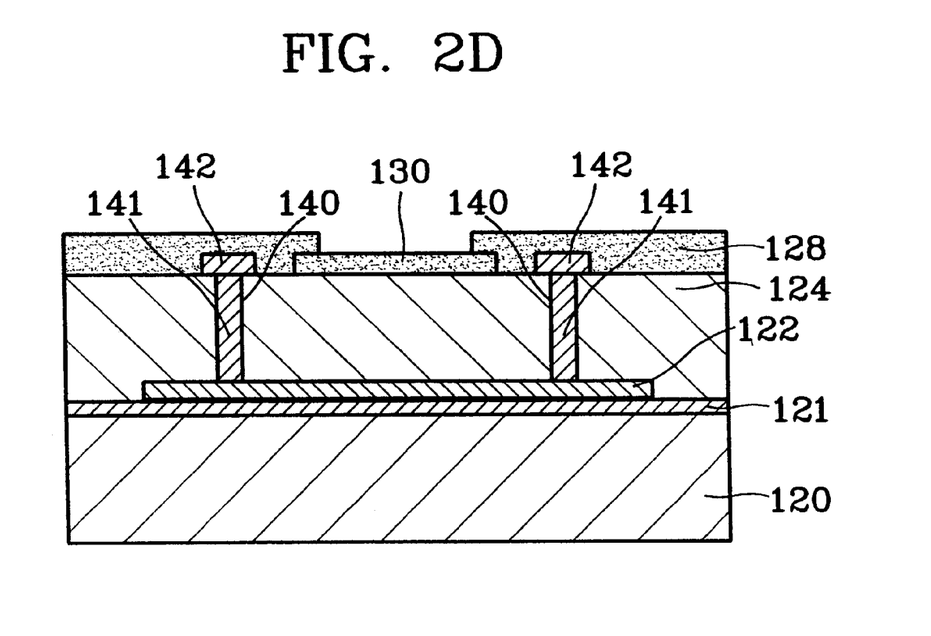

FIG. 2D, a passivation layer 128 is provided to cover the isolation frame 141 and the perimeter of the bonding pad 130. The resulting structure and corresponding circuit are now available for a subsequent bonding process. During bonding, the horizontal conductive portion 122 and the vertical isolation frame portion 141 serve as a containment frame to confine any cracks that may emanate from the edges of the bonding pad 130 as a result of stress incurred during the bonding process.

Figure 3A:
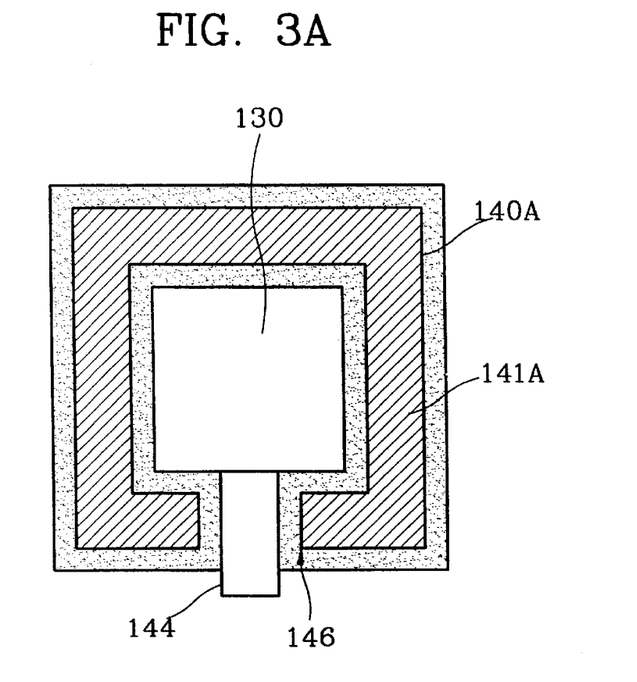
FIGS. 3A and 3B are top views of a bonding pad and vertical isolation frame surrounding the perimeter of the bonding pad, in accordance with the present invention.
Figure 3B:
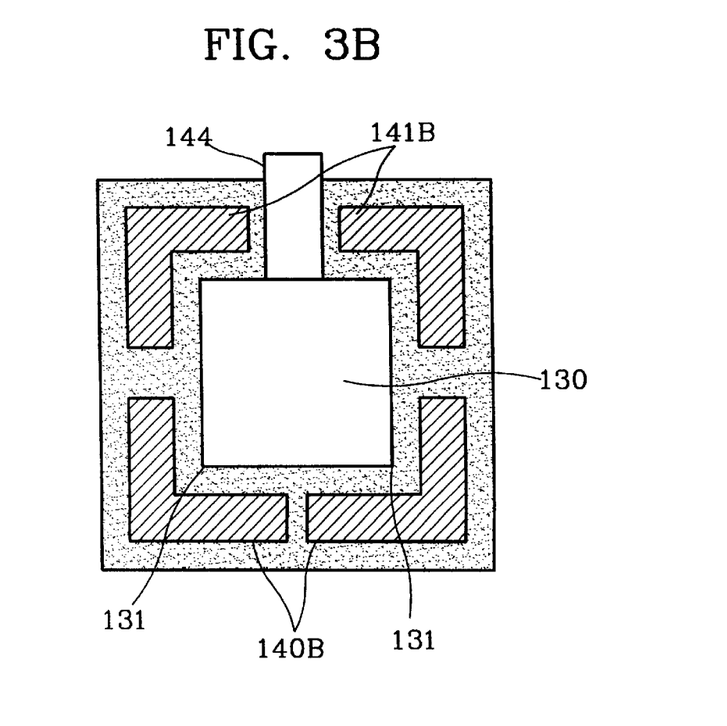

FIGS. 3A and 3B are top views of a bonding pad and vertical isolation frame surrounding the perimeter of the bonding pad, in accordance with the present invention. In FIG. 3A, it can be seen that the isolation frame 141A, formed in groove 140, is continuous, and encompasses the outer perimeter of the bonding pad 130. Optionally, a portion 146 of the frame 141A proximal to the boding pad interconnect 144 may be opened to allow for deposit of the interconnect 144. Alternatively, the frame may extend below the interconnect 144, and completely encompass the outer perimeter of the bonding pad 130.

In FIG. 3B, the frame comprises segmented "L-shaped" portions 141B that correspond with the corners 131 of the bonding pad 130, where a majority of any resulting cracks tend to concentrate.

In both examples, the vertical frame 141A, 141B, and underlying horizontal portion (see FIG. 2D) are configured such that when the structure is subjected to a subsequent bonding process, any resulting cracks or fissures generated in the ILD 124 under the stress of the procedure are confined within the vertical isolation frame 141A, 141B and the horizontal structure 122. In this manner, the cracks are prevented from extending beyond the boundary of the isolation frame 141A, 141B, and therefore prevented from adversely affecting the reliability of the remainder of the semiconductor circuit.

Figure 4A:
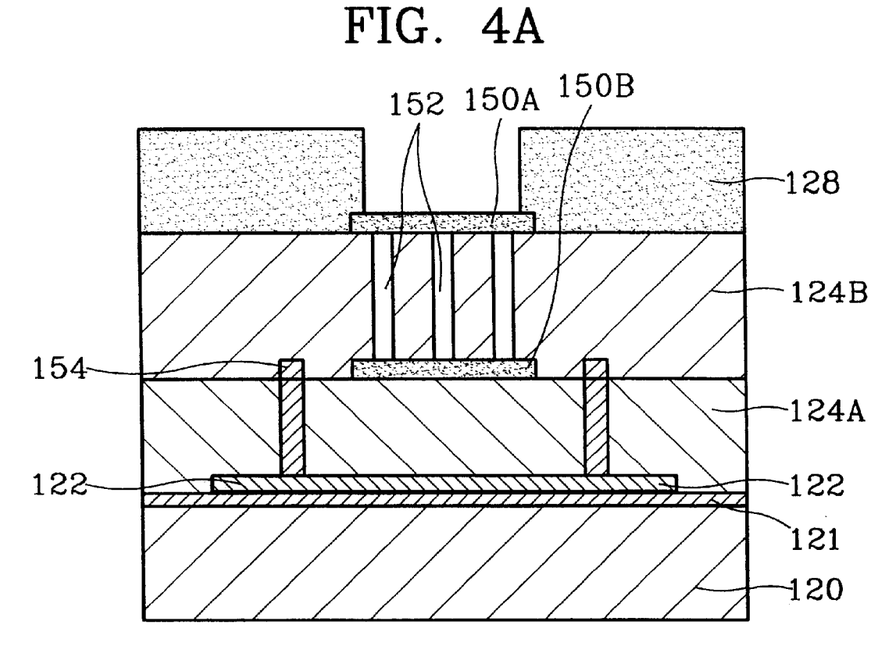
FIGS. 4A–4C are sectional side views of alternative embodiments of the bonding pad structure of the first preferred embodiment of the present invention.
Figure 4B:
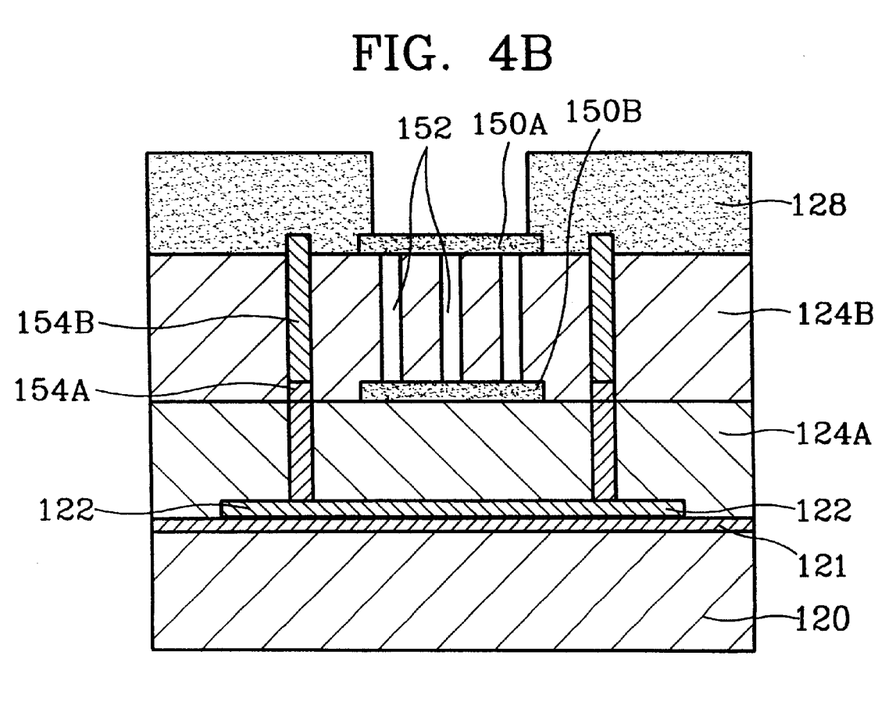
Figure 4C:
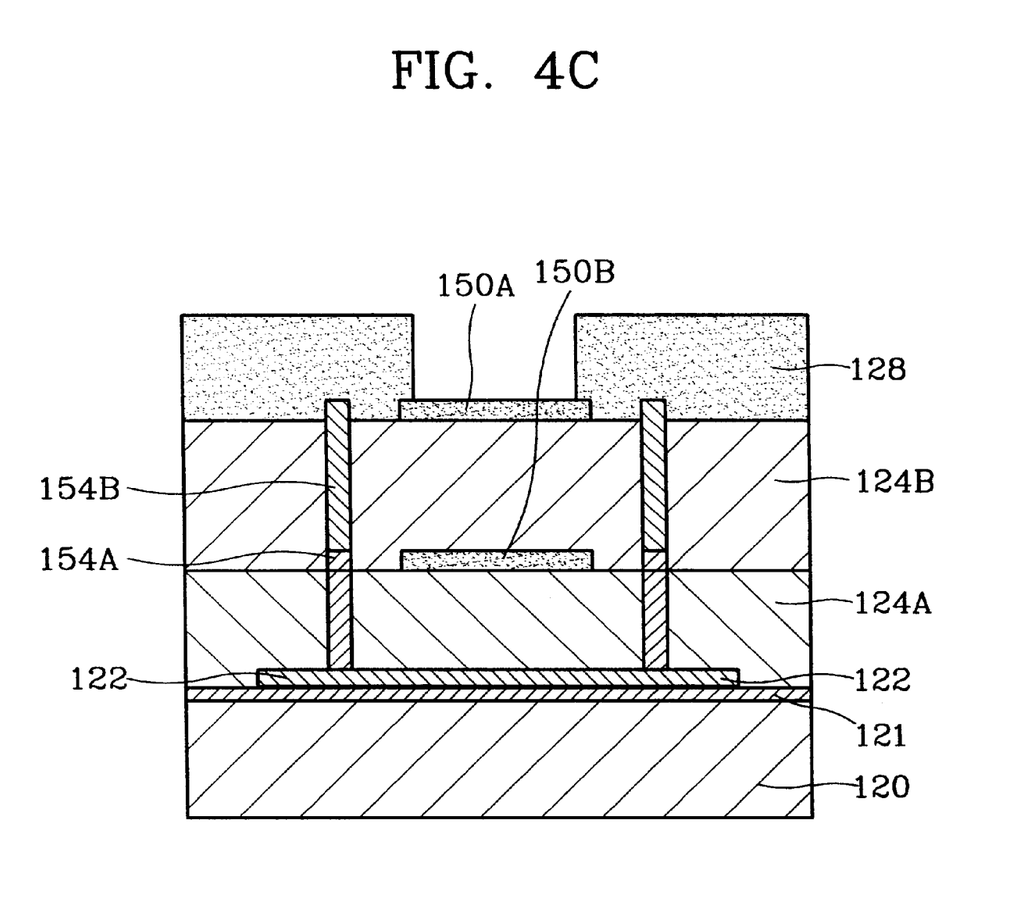

FIGS. 4A–4C are sectional side views of alternative embodiments of the bonding pad structure of the first preferred embodiment of the present invention. In each embodiment, the bonding pad comprises a multiple-layered bonding pad consisting for first and second layers 150A, 150B, the lower layer 150B being referred to herein as a "buffer" layer, as well known in the art.

In the embodiment of FIG. 4A, the horizontal portion 122 of the isolation frame is formed above a semiconductor substrate 120. A first ILD 124A is formed above the horizontal portion 122, and a vertical isolation frame 154 is formed in the first ILD 124A, as described above. The conductive material of the vertical isolation frame 154 may be provided contemporaneously with the formation of a lower portion 150B of the bonding pad. A second ILD 124B is formed above the resulting structure, and conductive plugs 152 are formed in the second ILD above the lower portion 150B of the bonding pad. A top portion of the bonding pad 150A is formed above the plugs 152, and a passivation layer 128 is patterned as shown. The vertical isolation frame 154 may be continuous for completely encompassing the perimeter of the lower portion 150B of the bonding pad, as shown in FIG. 3A, or may be segmented as shown in FIG. 3B to correspond with features of the bonding pad from which cracks are prone to concentrate.

In the embodiment of FIG. 4B, the vertical isolation frame may include a lower portion 154A, extending vertically through the first ILD 124A, and an upper portion 154B, formed above the lower portion 154A, and extending vertically through the second ILD 124B. This embodiment is configured to confine cracks sourced at both the upper and lower bonding pad portions 150, 150B to within the region of the ILD layers 124A, 124B below the bonding pad.

FIG. 4C is similar in structure to that of FIG. 4B, except that the upper and lower portions of the bonding pad 150A, 150B are not interconnected by the plugs 152 of FIGS. 4A and 4B. In this case (as well as the cases of FIGS. 4A and 4B), the lower portion 150B serves as a buffer layer to hinder the vertical propagation of cracks.

Figure 5A:
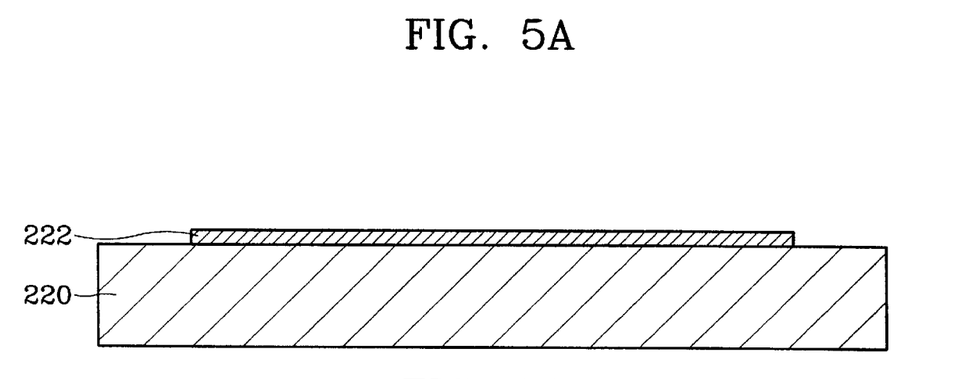
FIGS. 5A–5E are sectional side views of a process for forming a bonding pad structure in accordance with second preferred embodiment of the present invention.

FIGS. 5A–5E are sectional side views of a process for forming a bonding pad structure in accordance with second preferred embodiment of the present invention. With reference to FIG. 5A, a first etch stop layer 222 is provided on a substrate 220. The etch stop layer 222 is patterned to form a portion which will eventually lie below the region of the bonding pad.

Figure 5B:
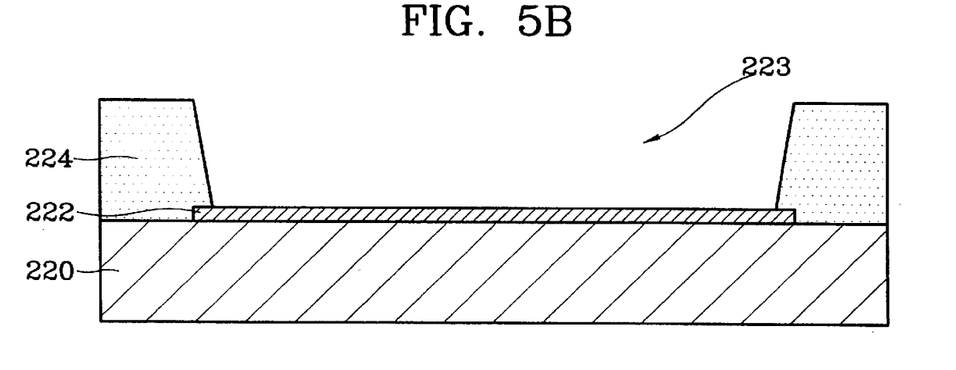

In FIG. 5B, a first ILD layer 224 is formed over the etch stop layer 222. An opening 223 is formed in the ILD 224 to the depth of the etch stop layer 222. Assuming that the materials of the ILD layer 224 and the underlying substrate 220 have etching selectivity with respect to each other, then the etch stop layer 222 may not be required for etching the opening 223.

Figure 5C:
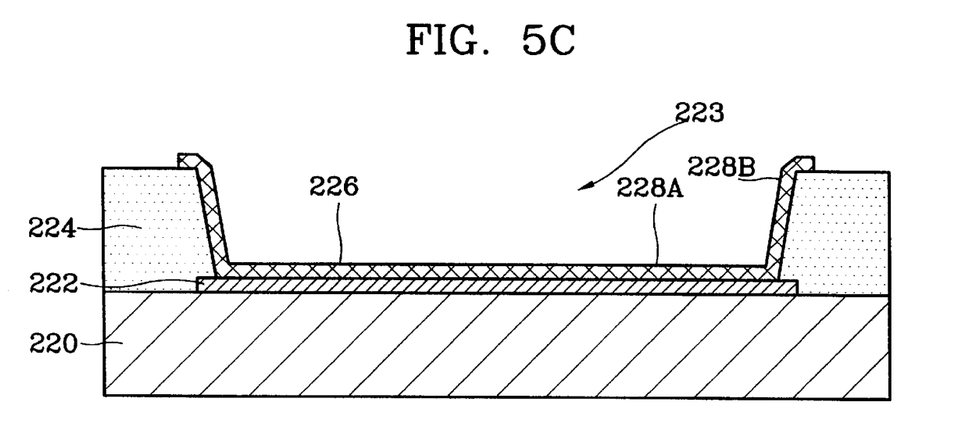

With reference to FIG. 5C, a conductive layer 226 is patterned above the inner walls of the opening 223. As a result, the conductive layer includes both a horizontal portion 228A, coating the bottom of the opening 223, and a vertical portion 228B coating the side walls of the opening 223. Assuming the etch stop layer 222 is employed, the lower part of the horizontal portion 228A may contact the etch stop layer 222.

Figure 5D:
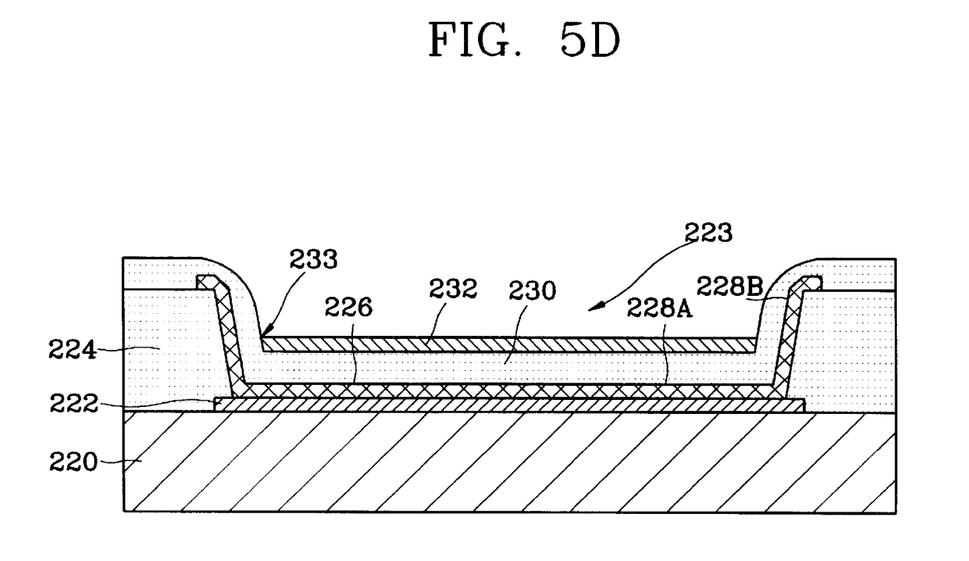

With reference to FIG. 5D, a second ILD layer 230 is provided above the resulting structure. In this case, an inter-metal dielectric (IMD) may optionally be employed as the second ILD layer. A bonding pad 232 is then patterned within the opening on the second ILD 232. The perimeter 233 of the bonding pad may, or may not, extend to the inner vertical wall of the second ILD 230, depending on the process used for forming the bonding pad 232.

Figure 5E:
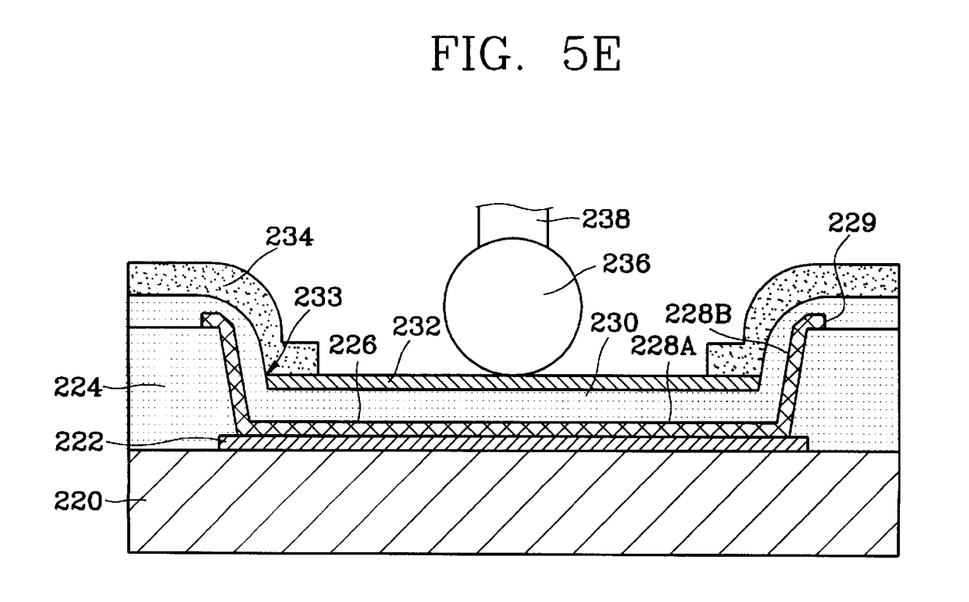

In FIG. 5E, a passivation layer 234 is provided about the exposed perimeter of the bonding pad 232, and a bonding lead 238 is bonded to the bonding pad 232 at weldment 236. The vertical position of the bonding pad 232 may be above, at, or below the top 229 of the vertical portion 228B of the containment frame, depending on the process employed, and the relative depths of the various ILD layers. In the manner described above, the horizontal and vertical portions 228A, 228B of the conductive layer 226 form an isolation frame for confining any cracks that may form in the second ILD 230, as a result of the bonding process.

Figure 6A:
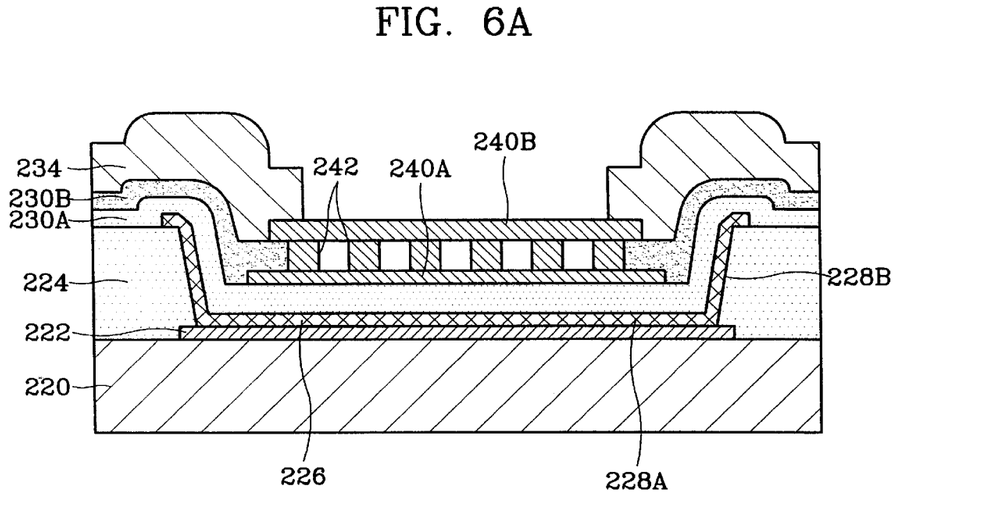
FIGS. 6A and 6B are sectional side views of alternative embodiments of the bonding pad structure of the second preferred embodiment of the present invention.
Figure 6B:
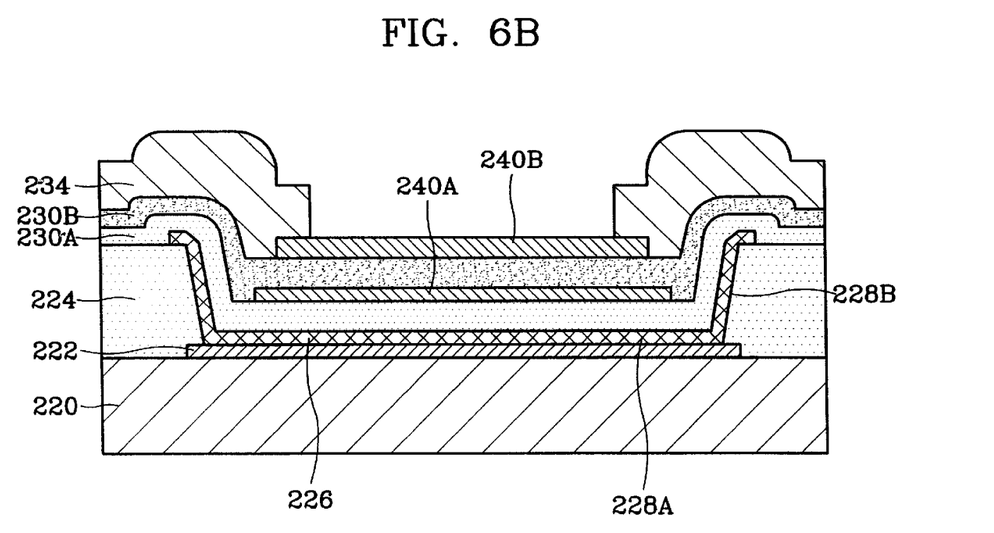

FIGS. 6A and 6B are sectional side views of alternative embodiments of the bonding pad structure of the second preferred embodiment of the present invention. In FIG. 6A, a buffer layer 240A is provided on the second ILD 230A, and a third ILD 230B is formed over the resulting structure. Conductive plugs 242 are formed in the third ILD, as shown, and an upper bonding pad layer 240B is formed on the third ILD layer. In FIG. 6B, the buffer layer 240A and bonding pad layer 240B are not coupled by the conductive plugs. Each multiple-layered bonding pad embodiment confers various benefits well known to those in the art.

In this manner, the second preferred embodiment of the present invention, shown in FIGS. 5 and 6 serves to confine cracks that may form as a result of the bonding process to within the crack isolation frame formed by the lower horizontal portion 228A and the vertical walls 228B of the conductive layer 226.

While this invention has been particularly shown and described with references to preferred embodiments thereof, it will be understood by those skilled in the art that various changes in form and details may be made herein without departing from the spirit and scope of the invention as defined by the appended claims.

For example, while the diagrams of FIGS. 2A–2D illustrate the first horizontal conductive layer 122 formed above a substrate 120, the layer 122 may be formed above intermediate ILD layers, for example including various multiple-layer metal patterns (for example interconnect patters), in a multiple-layered configuration.

We claim:

1. A semiconductor bonding pad structure comprising:
   an insulating layer;
   a bonding pad on the insulating layer having a horizontal boundary including a plurality of stress concentration regions comprising corner features having first and second edges; and
   at least one vertical frame comprising a conducting material provided vertically through the insulating layer, the at least one vertical frame being horizontally positioned beyond the horizontal boundary of the bonding pad and proximal to the stress concentration regions so as to at least partially frame both first and second edges of the corner features.

2. The semiconductor bonding pad structure of claim 1 further comprising a horizontal frame extending horizontally through the insulating layer below the bonding pad.

3. The semiconductor bonding pad structure of claim 2 wherein the horizontal frame comprises a conducting material.

4. The semiconductor bonding pad structure of claim 3 wherein the conducting material is selected from the group of a materials consisting of metal, polysilicon, and silicide.

5. The semiconductor bonding pad structure of claim 2 wherein the at least one vertical frame is positioned on, and in contact with, the horizontal frame.

6. The semiconductor bonding pad structure of claim 1 wherein the at least one vertical frame comprises multiple vertical frame segments positioned proximal to the stress concentration regions.

7. The semiconductor bonding pad structure of claim 1 wherein the at least one vertical frame substantially surrounds the horizontal boundary of the bonding pad.

8. The semiconductor bonding pad structure of claim 1 wherein the at least one vertical frame extends vertically through the entire depth of the insulating layer.

9. The semiconductor bonding pad structure of claim 1 wherein the at least one vertical frame extends vertically at least partially through the insulating layer.

10. The semiconductor bonding pad structure of claim 1 wherein the at least one vertical frame comprises a plurality of vertical frame segments vertically stacked through multiple insulating layers of the semiconductor device.

11. The semiconductor bonding pad structure of claim 1 further comprising:
a buffer layer formed on the insulating layer, the buffer layer having a horizontal boundary; and
an intermediate insulating layer provided on the buffer layer;
wherein the bonding pad is provided on the intermediate insulating layer above the buffer layer.

12. The semiconductor bonding pad structure of claim 11 wherein the at least one vertical frame extends vertically through the insulating layer, and is positioned beyond the horizontal boundary of the buffer layer.

13. The semiconductor bonding pad structure of claim 12 further comprising at least one vertical frame extension extending vertically through the intermediate insulating layer above the at least one vertical frame and being horizontally positioned beyond the horizontal boundary of the bonding pad.

14. The semiconductor bonding pad structure of claim 11 further comprising contact plugs formed through the intermediate insulating layer, electrically contacting the buffer layer and bonding pad.

15. A semiconductor bonding pad structure comprising:
a horizontal frame having a horizontal frame boundary;
an insulating layer above the horizontal frame;
a bonding pad on the insulating layer above the horizontal frame, the bonding pad having a horizontal pad boundary, the horizontal pad boundary being positioned substantially above the horizontal frame boundary; and
at least one vertical frame provided vertically through the insulating layer, the at least one vertical frame being horizontally positioned beyond the horizontal boundary of the bonding pad.

16. The semiconductor bonding pad structure of claim 15 wherein the at least one vertical frame is positioned on, and in contact with, the horizontal frame.

17. A semiconductor bonding pad structure comprising:
a first insulating layer provided on an underlying layer, the insulating layer having an opening therein, the opening having a substantially horizontal lower surface and a substantially vertical side surface;
a conductive layer provided in the opening, the conductive layer having a horizontal portion formed on the horizontal lower surface of the opening and a vertical portion formed on the vertical side surface of the opening;
a second insulating layer provided on the conductive layer; and
a bonding pad on the second insulating layer vertically positioned above the horizontal portion of the conductive layer and horizontally positioned within a frame defined by the vertical portion of the conductive layer.

18. The semiconductor bonding pad structure of claim 17 wherein the underlying layer comprises a substrate.

19. The semiconductor bonding pad structure of claim 17 wherein the underlying layer comprises an underlying insulating layer.

20. The semiconductor bonding pad structure of claim 17 wherein the underlying layer comprises an intermediate conductive layer.

21. The semiconductor bonding pad structure of claim 17 wherein the underlying layer has an etch selectivity with respect to the first insulating layer.

22. The semiconductor bonding pad structure of claim 17 wherein an upper surface of the vertical portion of the conductive layer defines an upper rim and wherein the bonding pad is vertically positioned below the upper rim.

23. The semiconductor bonding pad structure of claim 17 wherein an upper surface of the vertical portion of the conductive layer defines an upper rim and wherein the bonding pad is vertically positioned at or above the upper rim.

24. The semiconductor bonding pad structure of claim 17 wherein the second insulating layer forms a depression extending into the opening and wherein the bonding pad is positioned within the depression.

25. The semiconductor bonding pad structure of claim 24 wherein the depression includes inner side walls and wherein the bonding pad has an area less than the area defined between the inner side walls of the opening.

26. The semiconductor bonding pad structure of claim 17 further comprising:
a buffer layer formed on the second insulating layer, the buffer layer having a horizontal boundary; and
an intermediate insulating layer provided on the buffer layer;
wherein the bonding pad is provided on the intermediate insulating layer above the buffer layer.

27. The semiconductor bonding pad structure of claim 26 further comprising contact plugs formed through the intermediate insulating layer, electrically contacting the buffer layer and bonding pad.

28. A semiconductor bonding pad structure comprising:
an insulating layer;
a bonding pad on the insulating layer having a horizontal boundary;
at least one vertical frame comprising a conducting material provided vertically through the insulating layer, the at least one vertical frame being horizontally positioned beyond the horizontal boundary of the bonding pad, wherein the bonding pad is shaped in a geometry including stress concentration regions and wherein the at least one vertical frame is positioned proximal to the stress concentration regions; and
a horizontal frame extending horizontally through the insulating layer below the bonding pad and spaced apart from the bonding pad by the insulating layer.

29. The semiconductor bonding pad structure of claim 28 wherein the horizontal frame comprises a conducting material.

30. The semiconductor bonding pad structure of claim 28 wherein the at least one vertical frame is positioned on, and in contact with, the horizontal frame.

31. The semiconductor bonding pad structure of claim 28 wherein the at least one vertical frame comprises multiple vertical frame segments positioned locally with respect to the stress concentration regions.

32. The semiconductor bonding pad structure of claim 28 wherein the at least one vertical frame extends at least partially through the insulating layer.

33. The semiconductor bonding pad structure of claim 28 further comprising:

a buffer layer formed on the insulating layer, the buffer layer having a horizontal boundary; and an intermediate insulating layer provided on the buffer layer;

wherein the bonding pad is provided on the intermediate insulating layer above the buffer layer.

34. The semiconductor bonding pad structure of claim 33 wherein the at least one vertical frame extends vertically through the insulating layer, and is positioned beyond the horizontal boundary of the buffer layer.

* * * * *